(12) United States Patent
Yeom

(10) Patent No.: US 6,634,847 B1
(45) Date of Patent: Oct. 21, 2003

(54) METHOD AND AN APPARATUS FOR PICKING UP A MODULE IC IN A CUSTOMER TRAY OF A MODULE IC HANDLER

(75) Inventor: Seung Soo Yeom, Choongchungnam-do (KR)

(73) Assignee: Mirae Corporation, Choongchungnam-Do (KR)

( * ) Notice: Subject to any disclaimer, the term of this patent is extended or adjusted under 35 U.S.C. 154(b) by 0 days.

(21) Appl. No.: 09/437,745

(22) Filed: Nov. 10, 1999

(30) Foreign Application Priority Data

Nov. 17, 1998 (KR) .............................. 98-49289

(51) Int. Cl.[7] .............................................. H01L 21/68
(52) U.S. Cl. ............. 414/416.08; 414/403; 414/416.01; 414/778; 414/811; 414/938
(58) Field of Search ...................... 414/226.02, 226.04, 414/416.01, 416.08, 419, 425, 778, 811, 938, 403, 404, 416.02, 421; 206/707

(56) References Cited

U.S. PATENT DOCUMENTS

| | | | | |
|---|---|---|---|---|
| 4,568,234 A | * | 2/1986 | Lee et al. ................... 414/404 |
| 4,768,640 A | * | 9/1988 | Sticht ..................... 414/416.01 |
| 4,790,709 A | * | 12/1988 | Sakimori et al. ...... 414/416.01 |
| 5,009,053 A | * | 4/1991 | Langenbeck et al. .......... 53/58 |
| 5,161,938 A | * | 11/1992 | Traegaardh ............. 414/416.01 |
| 5,702,224 A | * | 12/1997 | Kubota ........................ 414/403 |
| 5,765,989 A | * | 6/1998 | Kraus et al. ............ 414/416.01 |
| 5,772,387 A | * | 6/1998 | Nakamura et al. ........... 414/403 |
| 5,779,203 A | * | 7/1998 | Edlinger ................... 248/178.1 |
| 5,947,675 A | * | 9/1999 | Matsushima ........... 414/416.08 |
| 6,033,521 A | * | 3/2000 | Allen et al. ................. 414/938 |
| 6,062,799 A | * | 5/2000 | Han et al. .............. 414/416.08 |
| 6,152,680 A | * | 11/2000 | Howells et al. ............. 414/782 |
| 6,241,449 B1 | * | 6/2001 | Kroos ........................ 414/419 |
| 6,264,415 B1 | * | 7/2001 | Boochakorn ................ 414/403 |

FOREIGN PATENT DOCUMENTS

| | | | | |
|---|---|---|---|---|
| JP | 63-258037 | * | 10/1988 | ................. 414/938 |
| JP | 01-57730 | * | 3/1989 | ................. 414/938 |

* cited by examiner

Primary Examiner—James W. Keenan
(74) Attorney, Agent, or Firm—Fleshner & Kim, LLP

(57) ABSTRACT

A method and apparatus for picking up module ICs from customer trays utilizes a rotating table. In the apparatus and method, the customer tray is placed on the rotating table, and the rotating table is inclined a predetermined amount. The inclination of the rotating table causes the customer tray, and the module ICs held in the tray, to also be inclined. A grasping apparatus is then used to pick up the module ICs from the customer tray. The pick up apparatus may also be configured to incline the same amount as the rotating table. Once the module ICs have been picked up from the customer tray, they can be delivered to an unloading station, or to a module IC carrier.

15 Claims, 7 Drawing Sheets

METHOD AND AN APPARATUS FOR PICKING UP A MODULE IC IN A CUSTOMER TRAY OF A MODULE IC HANDLER

BACKGROUND OF THE INVENTION

1. Field of the Invention

The present invention relates to a module IC (Integrated Circuit) handler used to test a module IC that has been manufactured, and more particularly to a method and an apparatus for picking up a module IC from a customer tray of the module IC handler, including a picking-up means for picking up the module IC.

2. Description of the Conventional Art

Typically, a module IC refers to a structure provided with a substrate whose one side or both sides are used for fixedly mounting a plurality of ICs and electric components, for example, by soldering, and have the capability of extending their respective capacities when they are coupled to a mother substrate.

Such a module IC provides higher added-value when sold, compared with the separate, individual sale of each IC as a final product. For this reason, IC manufacturers tend to develop module ICs as main products and sell them as such.

However, module ICs on the market are relatively expensive and therefore require higher reliability. This requires passing strict quality tests; i.e, passing only products determined to be good, and discarding all module ICs determined not to be good.

Transfer of module ICs between the various processes required for manufacturing a module IC is accomplished with a customer tray 1, as shown in FIGS. 1 and 2, and the module ICs can be safely maintained in the customer tray.

However, each insertion slot 2 provided inside of customer tray 1 has a much wider width relative to the width of a module IC 3.

This configuration of customer tray 1 is fixed and is used to accommodate various kinds of module ICs whose widths may be different for each kind of module IC, and to maintain the ICs therein.

Further, module ICs may be supplied in packages of customer trays 1 containing test-finished module ICs therein, to reduce manufacturing costs.

To produce the customer tray 1 at a low cost, the customer tray is not injection molded, but rather it is vacuum-molded. However, this yields bad precision for insertion slots 2.

When module ICs 3 to be tested are accommodated in customer tray 1, the module ICs 3 are placed in insertion slots 2 with arbitrarily different inclinations of the ICs 3, as shown in FIG. 2, due to the distinct configuration of customer tray 1. The distances, for example, t1, t2 and t3 in FIG. 2, between the inserted module ICs may be different from each other. Therefore, fingers 5 of a plurality of picking-up means 4 (see FIG. 4), with an interval between the fingers being constant for each picking-up means, do not match the above distances.

For this reason, a test tray 6 as shown in FIG. 3 needs to be employed, which is made to a high precision in order to permit testing of a module IC.

With the use of such a test tray 6, the operator has to manually pick up the module ICs inserted in slots 3 of customer tray 1, and then insert the module ICs into insertion slots 7 provided inside of test tray 6. Furthermore, an operator must then place test tray 6 at a loading position in the handler. This causes a problem in that operation efficiency is lowered.

Further, production of an extra test tray 6 is necessitated, which raises manufacturing costs, and which prevents easy use of customer tray 1 in an unloading position. Also, there is a problem in that the handler must be increased in size.

SUMMARY OF THE INVENTION

Therefore, it is an object of the present invention to provide a picking-up means that directly picks up a manufactured module IC from a customer tray, and then loads it into a carrier or a test socket at a test site.

In order to accomplish the above object, there is provided, in a module IC handler using a customer tray, a method for picking up module ICs contained in the customer tray, the method comprising the steps of: placing the customer tray containing the module ICs to be tested on a rotating table disposed at a loading position; inclining the rotating table in one direction by an inclination amount to thereby incline the module ICs contained in the customer tray in the same direction as the table; rotating a picking-up means from an initial non-inclined state by a rotation amount equivalent to the inclination amount of the rotating table; picking up module ICs from the customer tray with the picking-up means, and returning the picking-up means to the initial non-inclined state; loading the picked-up module IC into a carrier or a test socket; and repeating the rotating, picking up and loading steps until all module ICs have been removed from the customer tray.

According to another aspect of the present invention, there is also provided, in a module IC handler using a customer tray, an apparatus for picking up module ICs contained in the customer tray, the apparatus comprising: a rotating table, on which the customer tray is placed, wherein the rotating table is pivotable; an eccentric cam operatively coupled to the rotating table, wherein the cam is configured such that rotation of the cam causes the rotating table to pivot about the axis; and a driver configured to rotate a picking-up means by a rotation amount that matches the rotation of the rotating table, the picking-up means being used for picking up module ICs contained in the customer tray.

DETAILED DESCRIPTION OF THE INVENTION

Figure 1:
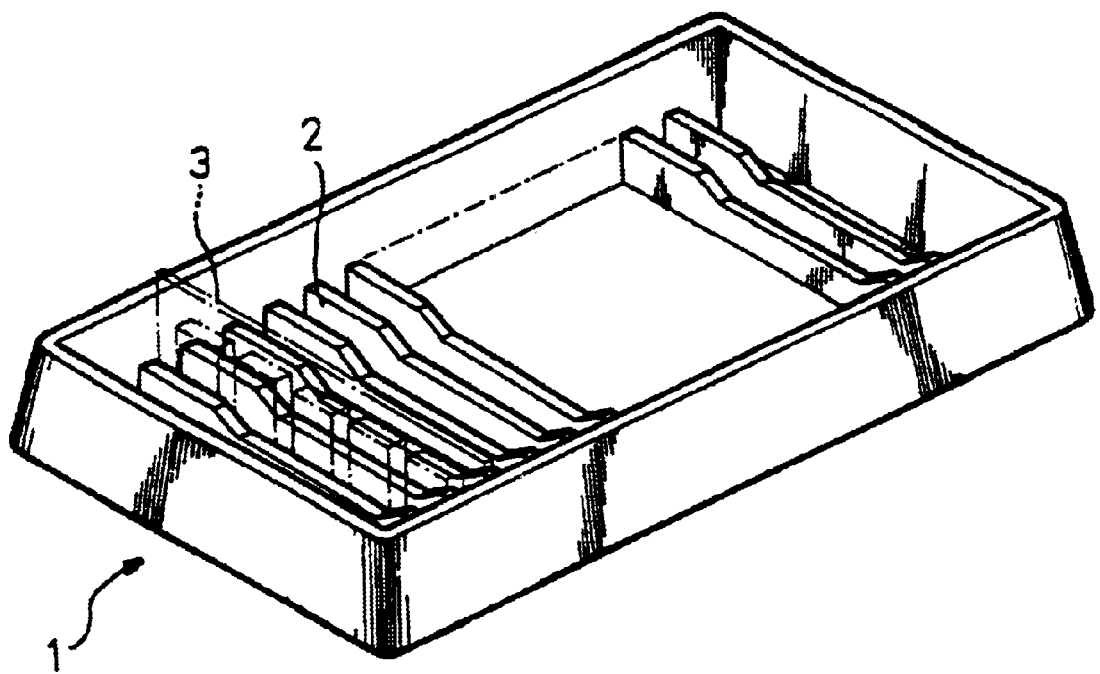
FIG. 1 is a perspective view of a prior art customer tray.
Figure 2:
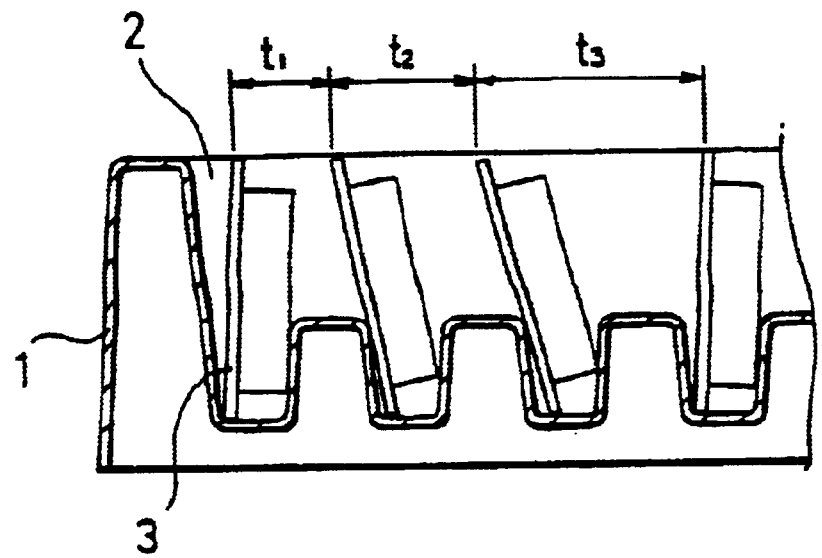
FIG. 2 is a vertical sectional view showing the state that module ICs are contained in the prior art customer tray.
Figure 3:
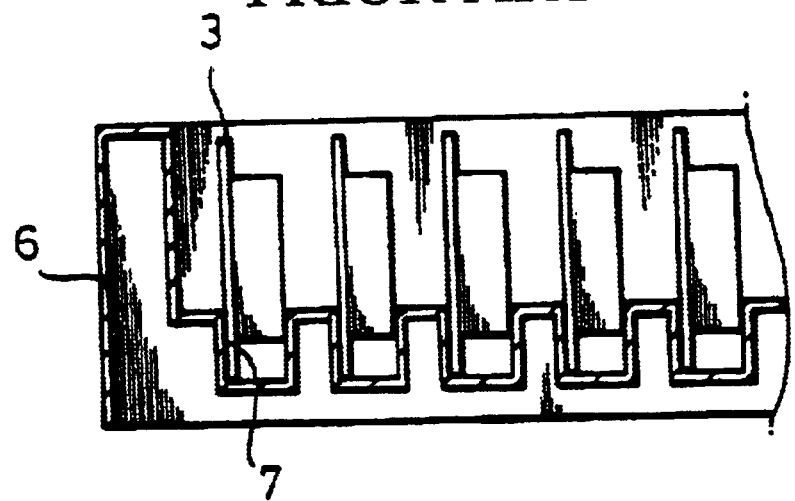
FIG. 3 is a vertical sectional view showing a prior art test tray.
Figure 4:
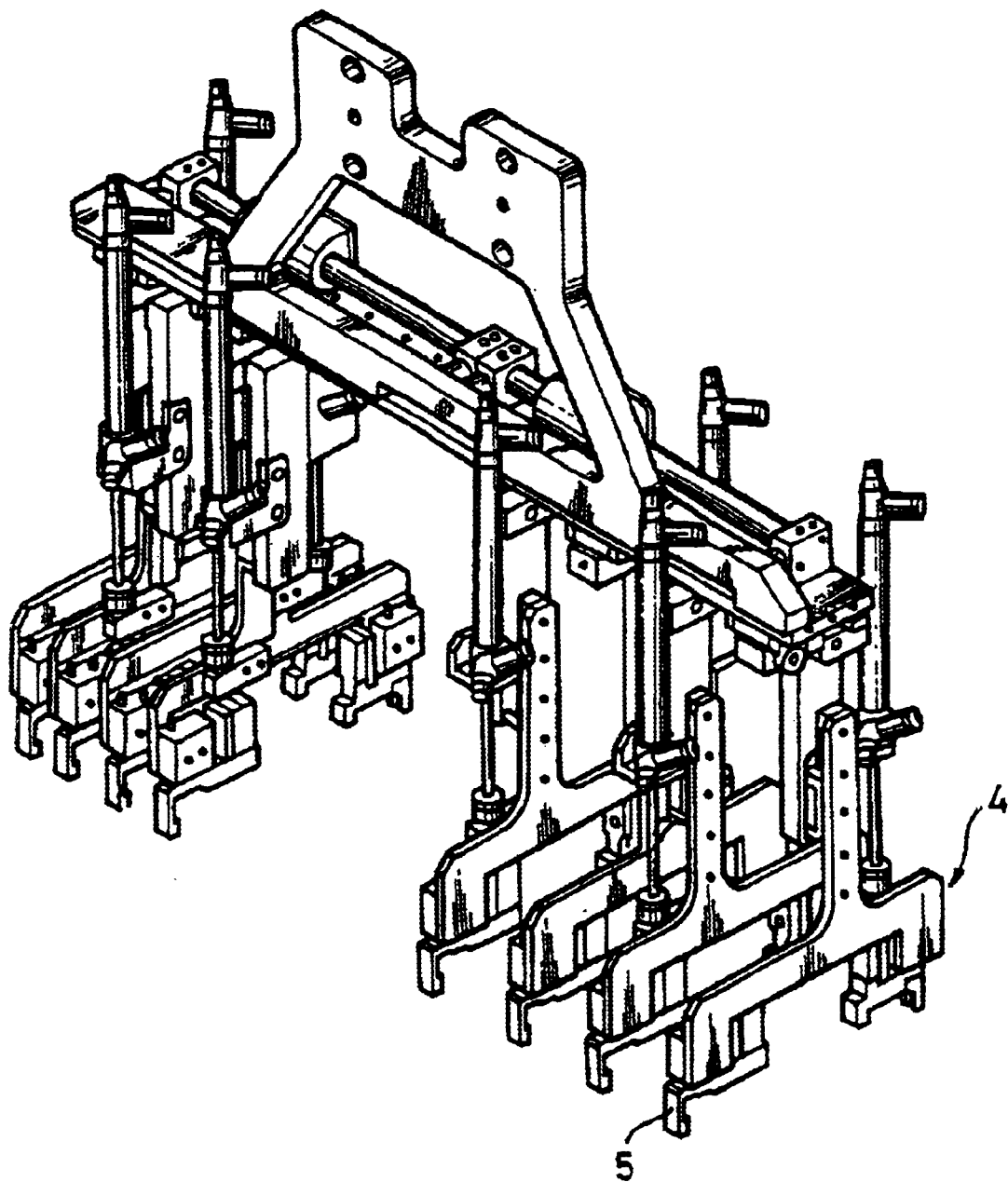
FIG. 4 is a perspective view of a prior art picking-up means.
Figure 5:
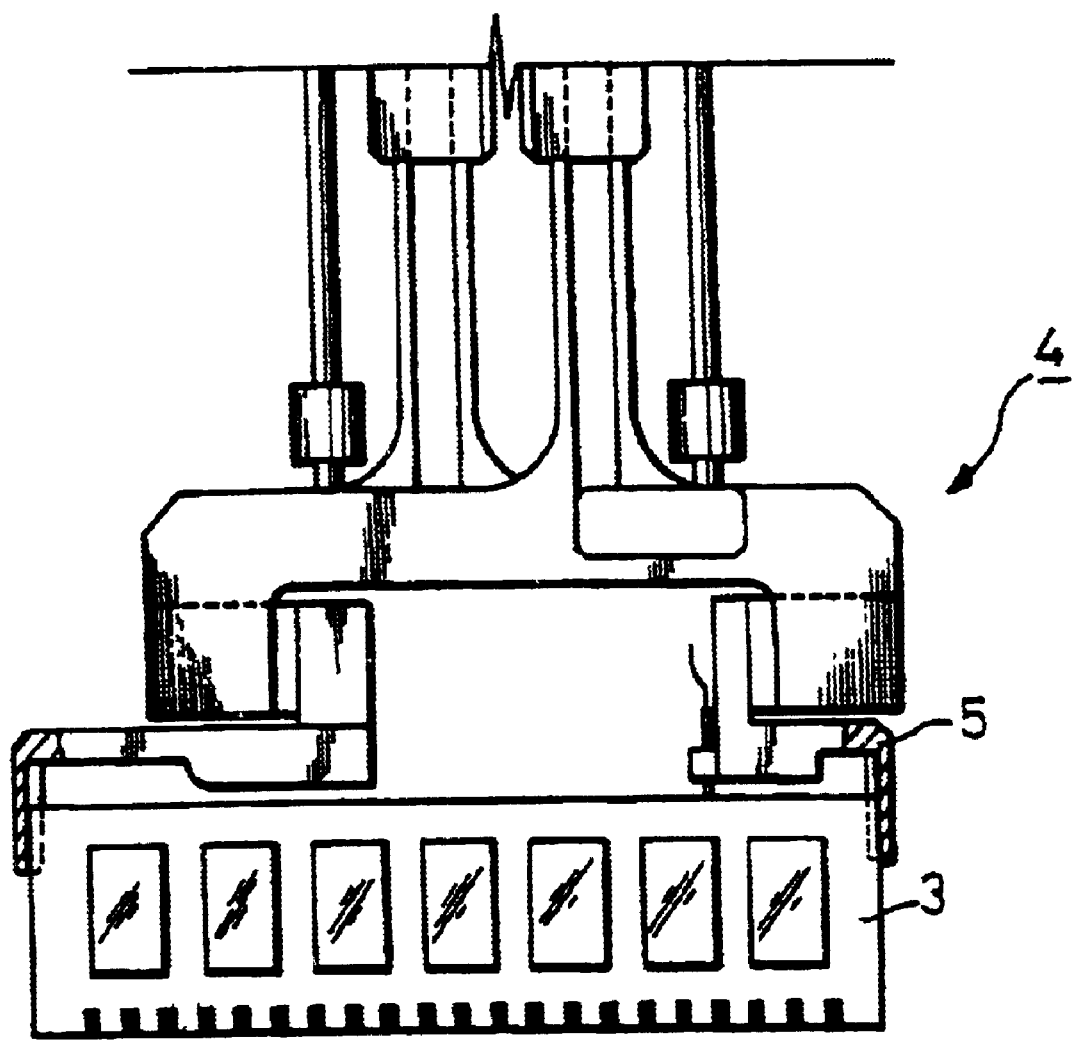
FIG. 5 is a front view showing the state that the prior art picking-up means picks up the module IC.
Figure 6:
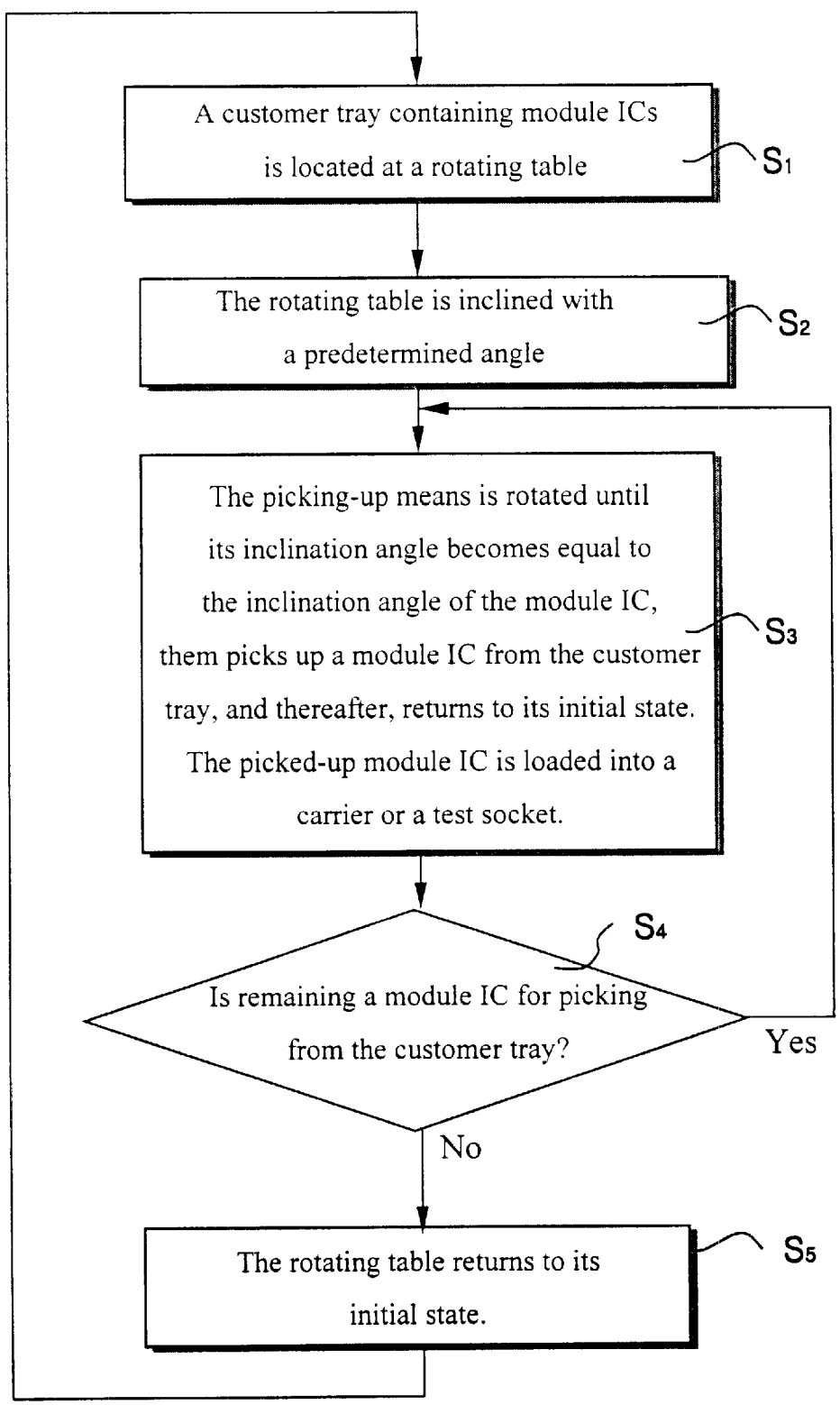
FIG. 6 is a flow chart that shows a picking-up method according to the present invention.

Referring to FIGS. 6 and 8, a preferred embodiment of the present invention will be described in detail.

FIG. 6 is a flow chart that shows a picking-up method according to the present invention. The operation starts at step S1, in which a customer tray 1 containing module ICs 3 to be tested is placed on a rotating table 8.

Figure 7A:
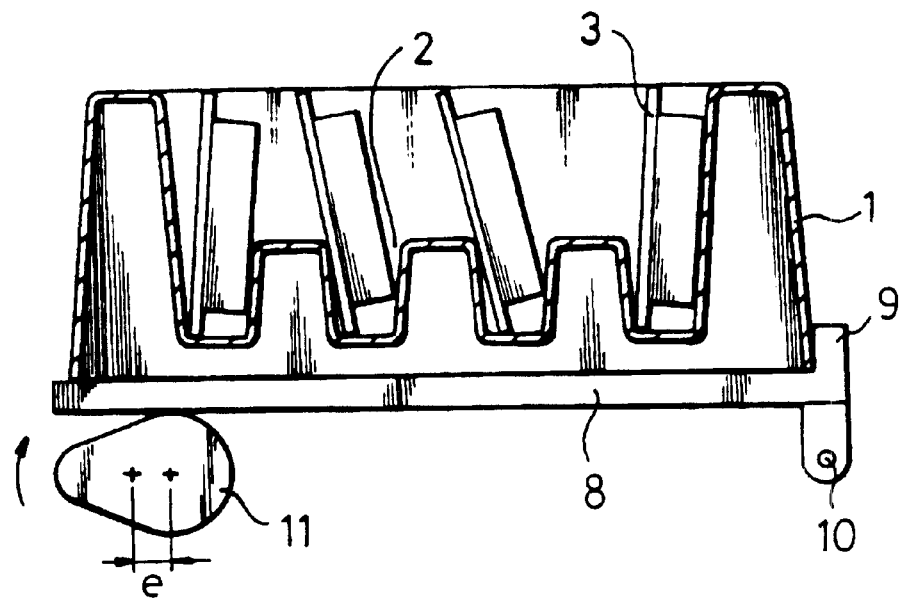
FIGS. 7a and 7b show a loading unit of the handler to which the present invention is applied.

The customer tray 1 placed on the rotating table 8 is provided with insertion slots 2 each for receiving a module IC 3 having a narrower width than the width of slots 2. An arbitrarily different inclination for each module IC in each slot 2 is thus caused by different widths between a module IC 3 and a slot 2, as shown in FIG. 7a.

After the customer tray 1 is placed on the rotation table 8, at step S1, the table 8 is inclined in one direction so that module ICs may be inclined in the same one direction corresponding thereto.

During such inclination of the rotating table 8 having the customer tray 1 placed thereon in one direction, a stopper 9 supports one side (i.e., a surface defining a bottom dead point when inclined) of the customer tray 1 so as to limit further movement of the customer tray 1.

Such an operation can be effected due to the rotating table 8 having disposed at one end thereof an axis 10 on which the table 8 pivots, and a cam 11 disposed at a second end thereof, the cam being rotated by a motor (not shown) that functions as a driving means.

It is noted that an inclination angle of the rotating table 8 is determined based on an eccentric amount e of the eccentric cam 11, as is shown in FIG. 7a.

With all of the module ICs being inclined in a same direction, picking-up means 4, which is used to pick up a module IC from the customer tray, is inclined to approximately the same inclination angle as that of the module IC to be picked up.

The picking-up means 4 is rotated until its inclination angle becomes approximately equal to the inclination angle of the module IC 3 to be picked up. Picking-up means 4 then picks up the module IC 3 from the customer tray 1, and thereafter returns to its initial inclination state. The picked-up module IC 3 is then loaded into a carrier or a test socket. These series of procedures are repeated, at step S3, if a module IC remains in the customer tray, step S4.

Repeating the above mentioned procedures comprises: picking up the module IC from the customer tray 1 when the picking-up means 4 is inclined to approximately the same angle as that of the module IC; returning the picking-up means to its initial inclination state; and loading the picked-up module IC 3 into a carrier or a test socket. When the above procedures are completed, the rotating table is returned to its initial inclination state for subsequent loading of module ICs (steps S5 and S1).

When the rotating table 8 on which an empty customer tray is located returns to its initial inclination state, the empty customer tray is unloaded from the rotating table 8 and a new customer tray is placed on the rotating table in a manner as described above. Therefore, the series of procedures can be repeated.

The following explains operation of an apparatus according to one embodiment of the present invention, in which the apparatus picks up a module IC from customer tray 1 and then loads the picked-up module IC into a carrier or a socket in a manner as discussed above.

Figure 7B:
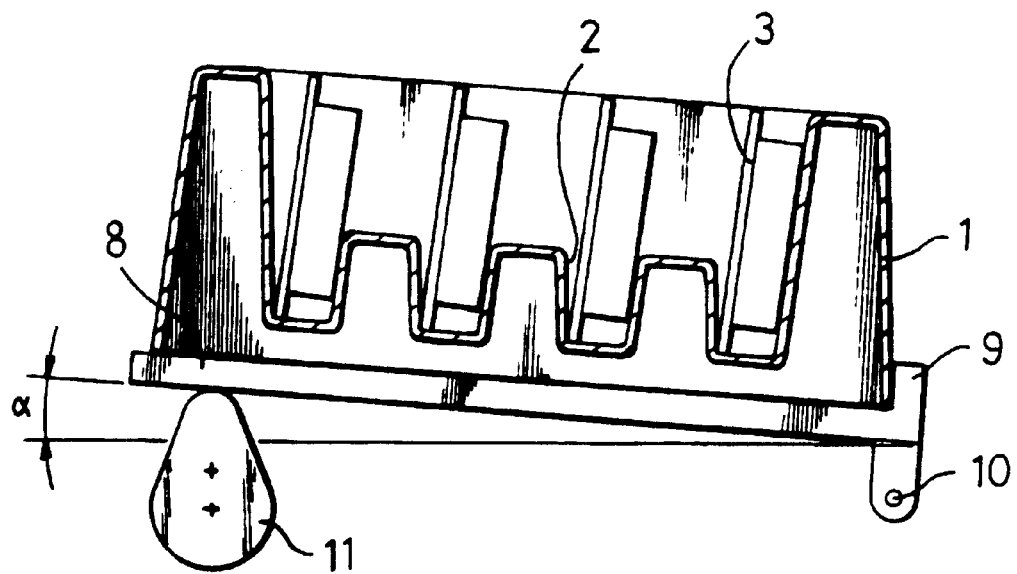
Figure 8A:
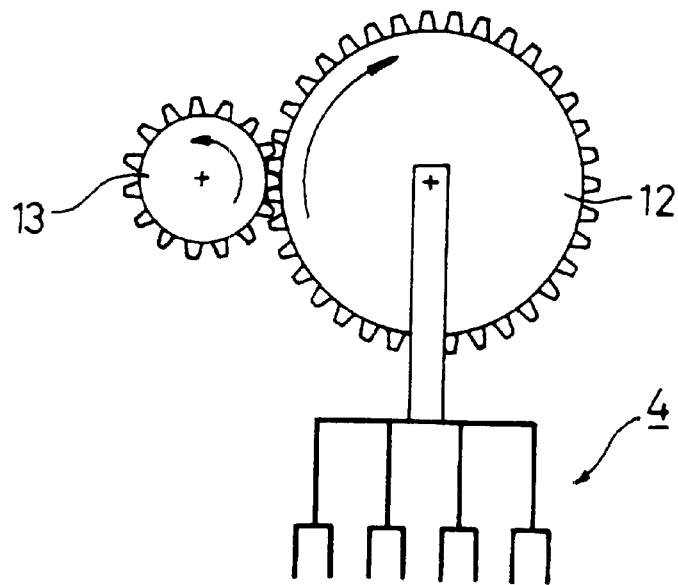
FIGS. 8a and 8b show a picking-up means according to the present invention.
Figure 8B:
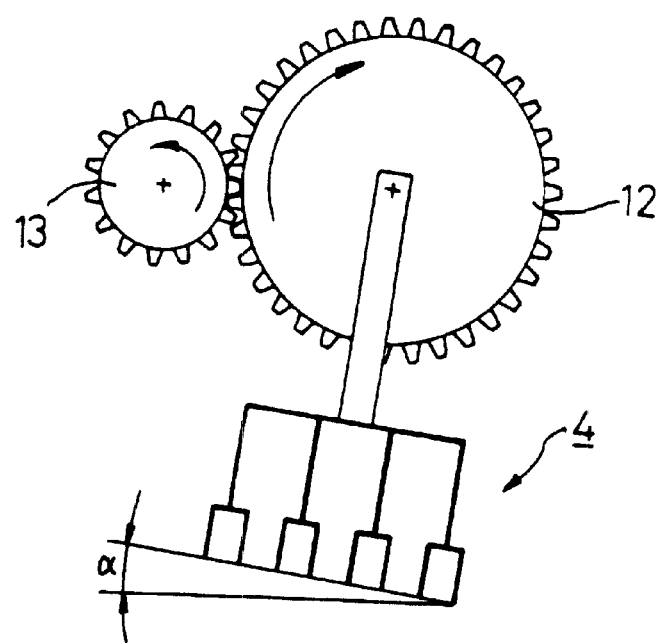

FIGS. 7a and 7b show a loading unit of the handler to which the present invention is applied, and FIGS. 8a and 8b show a picking-up means according to the present invention. According to the present invention, there is provided, at the loading position, a rotating table 8 on which customer tray 1 is placed and having a stopper 9 formed at one side surface thereof, the stopper 9 acting as a reference plane to an inclination angle α created by inclination of customer tray 1 due to inclination of the rotating table and maintaining tray 1 at that inclined position.

Below a bottom surface of table 8, there is operatively provided an eccentric cam 11 for inclining table 8 by a specific eccentric amount when cam 11 is rotated by an appropriate driving means. The specific eccentric amount is defined to produce inclination of the rotating table that corresponds to inclination of the picking-up means that is used to pick up a module IC 3 in customer tray 1.

According to one embodiment of the present invention, the driving means may comprise: a spur gear 12 to which a picking-up means 4 is fixed; and a driving gear 13 engaged with the spur gear; and a drive motor that rotates spur gear 12.

It will be understood by those skilled in the art that the present invention is not limited thereto; i.e., alternatively, the driving means may comprise a spur gear 12, to which the picking-up means 4 is fixed, a rack engaged with spur gear 12, and a cylinder that drives the rack back and forth.

Thus, as shown in FIG. 7a, after customer tray 1, having module ICs 3 to be tested contained therein, is placed on rotating table 8 at a loading position by a transferring means (not shown), if the driving means rotates eccentric cam 11 by a preset angle, this causes the rotating table to pivot on axis 10 by eccentric amount 'e' given by eccentric cam 11 that operates below rotating table 8. Consequently, the rotating table can be inclined by a constant angle α with respect to a horizontal line, as shown in FIG. 7b.

As described above, inclination of rotating table 8 allows customer tray 1, located on the rotating table, to be correspondingly inclined to the same inclination angle as that of table 8, which causes the tray to slide until one side surface of customer tray 1 abuts against stopper 9. Consequently, all module ICs in respective insertion slots 2 are inclined to the same degree and the same direction.

Because all of the module ICs are inclined to the same degree, the picking-up means also needs to be inclined to the same angle of inclination as the module ICs in order to facilitate picking up of the module ICs.

To effect this, the driving means rotates driving gear 13, which in turn rotates spur gear 12. Because picking-up means 4 is fixed to spur gear 12, pivoting spur gear 12 by an inclination angle α means that the inclination angle of picking-up means 4 matches the inclination angle of rotating table 8.

Since the eccentric amount 'e' of eccentric cam 11 is previously determined, the rotation angle of the picking-up means 4 can be set when initial settings of the apparatus are made.

Inclination of picking-up means 4 may be made when or before the picking-up means 4 is transferred to a position over customer tray 1.

For example, in the case in which picking-up means 4 is inclined by a predetermined angle after being transferred to a position over customer tray 1, the picking-up means 4 descends due to operation of a cylinder (not shown), a set of fingers picks up a module IC 3 from customer tray 1, and the picking-up means 4 is elevated to a top dead point. The module IC that is picked up is vertically maintained by the driving means, which makes it possible to load the picked-up module IC into a carrier or a socket for testing.

The picking up operation, by which the picking-up means 4 picks up a module IC 3 from a customer tray 1, may be similarly conducted using any method known in this art, and therefore the detailed description therefor will be omitted.

The sequential procedures of the picking-up means 4 are repeated until all the module ICs 3 in customer tray 1 are picked up and loaded into a test socket or a carrier. After rotating table 8 is returned to an initial horizontal state, the unloading operation of the empty customer tray from the rotating table is made, and a new customer tray filled with the module ICs to be tested is placed on the rotating table. Therefore, the loading of module ICs into a carrier or a test socket can be continuously performed.

As described above, the present invention has the following advantages. First, module ICs contained in customer tray 1 can be directly loaded into a carrier or a test socket, and do not require using a separate test tray.

Second, the present invention does not require an expensive test tray, thus allowing manufacturing costs to be reduced.

Third, since it is not necessary to load manufactured module ICs contained in a customer tray into a test tray, productivity is maximized.

Finally, it is possible to automatically transfer an empty customer tray to an unloading position, the empty customer tray having been obtained by transferring the module ICs contained therein into a carrier or a test socket.

What is claimed is:

1. In a module IC handler using a customer tray, a method for picking up module ICs contained in the customer tray, the method comprising the steps of:

placing the customer tray, containing the module ICs to be tested, on a rotating table disposed at a loading position;

inclining the rotating table in one direction by an inclination amount to thereby incline the module ICs contained in the customer tray in the same direction as the table;

rotating a picking-up means from an initial non-inclined state by a rotation amount equivalent to the inclination amount of the rotating table;

picking up module ICs from the customer tray with the picking-up means, and returning the picking-up means to the initial non-inclined state;

loading the picked-up module ICs into a carrier or a test socket; and repeating the rotating, picking up and loading steps until all module ICs have been removed from the customer tray.

2. The method as defined in claim 1, wherein the inclining step comprises rotating an eccentric cam.

3. The method as defined in claim 1, the method further comprising the step of:

transferring an empty customer tray to an unloading position after all the module ICs have been removed from the customer tray.

4. In a module IC handler using a customer tray, an apparatus for picking up module ICs contained in the customer tray, the apparatus comprising:

a rotating table configured to receive and securely hold the customer tray thereon, wherein the rotating table is pivotable about an axis;

a first driver comprising an eccentric cam operatively coupled to the rotating table, wherein the cam is configured such that rotation of the cam causes the rotating table to pivot about the axis;

a picking-up means positioned substantially above the rotating table and configured to pick up module ICs from above contained vertically oriented in the customer tray; and a second driver configured to rotate the picking-up means by a rotation amount that matches the rotation of the rotating table and customer tray.

5. The apparatus as defined in claim 4, wherein the second driver further comprises:

a spur gear to which the picking-up means is coupled; and a driving gear engaged with the spur gear and rotated by a motor.

6. A method for handling module integrated circuits (ICs), comprising:

placing a tray containing a plurality of module ICs on a rotating table;

inclining the rotating table and the tray a predetermined amount;

inclining a grasping device by an amount approximately equal to the predetermined amount that the rotating table is inclined;

picking up at least one module IC in the inclined tray with the grasping device;

delivering the at least one module IC to one of a test site and an unloading site by moving the grasping device to one of the test site and the unloading site; and releasing the at least one module IC.

7. The method of claim 6, wherein, prior to performing the delivering step, the grasping device is declined back to an initial orientation.

8. The method of claim 6, wherein, if the tray is not empty, repeating in succession until the tray is empty the steps of picking up, delivering and releasing.

9. The method of claim 6, wherein, if the tray is empty, declining the rotating table to an initial orientation.

10. A method for handling module integrated circuits (ICs), comprising:

placing a tray containing a plurality of module ICs on a rotating table;

inclining the rotating table and the tray a predetermined amount;

picking up at least one module IC in the inclined tray with a grasping device;

delivering the at least one module IC to one of a test site and an unloading site by moving the grasping device to one of a test site and an unloading site; and releasing the at least one module IC.

11. An apparatus for picking up module integrated circuits (ICs), comprising:

a rotating table configured to securely hold a tray in which a plurality of module ICs is stored, wherein the rotating table is rotatable about a first axis;

a first driver configured to rotate the rotating table about the first axis via an eccentric cam which is connected to the first driver and which is configured to rotate the rotating table when the first driver operates;

a grasping device positioned substantially above the rotating table and configured to pick up module ICs from above contained vertically oriented in the tray, wherein the grasping device is rotatable about a second axis; and a second driver configured to rotate the grasping device about the second axis.

12. The apparatus of claim 11, wherein the eccentric cam is configured to engage a bottom surface of the rotating table.

13. The apparatus of claim 11, wherein the cam and the first driver are configured to rotate the rotating table by a predetermined amount about the axis.

14. The apparatus of claim 11, wherein the grasping device is configured to rotate about the second axis by the same amount that the rotating table rotates.

15. The apparatus of claim 11, wherein the grasping device is configured to deliver ICs to one of a test site and an unloading site.

* * * * *